(12) United States Patent
Luo et al.

(10) Patent No.: US 11,502,643 B2
(45) Date of Patent: Nov. 15, 2022

(54) DEGRADATION PHENOMENON TREATMENT METHOD BASED ON PHOTOVOLTAIC MODULE, AND RELATED DEVICE

(71) Applicant: Huawei Digital Power Technologies Co., Ltd., Shenzhen (CN)

(72) Inventors: Tao Luo, Dongguan (CN); Xiaming Jing, Shenzhen (CN); Boning Huang, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 122 days.

(21) Appl. No.: 17/014,584

(22) Filed: Sep. 8, 2020

(65) Prior Publication Data

US 2020/0403569 A1 Dec. 24, 2020

Related U.S. Application Data

(63) Continuation of application No. PCT/CN2019/084518, filed on Apr. 26, 2019.

(30) Foreign Application Priority Data

Apr. 27, 2018 (CN) .......................... 201810397532.1

(51) Int. Cl.
*H02S 50/10* (2014.01)
*G01R 31/26* (2020.01)

(52) U.S. Cl.
CPC .......... *H02S 50/10* (2014.12); *G01R 31/2642* (2013.01)

(58) Field of Classification Search
None
See application file for complete search history.

(56) References Cited

U.S. PATENT DOCUMENTS 9,287,712 B2 * 3/2016 Borup ...................... H02J 3/46
9,923,517 B1 3/2018 Wang et al.
(Continued)

FOREIGN PATENT DOCUMENTS

CN 103475208 A 12/2013
CN 103888052 A 6/2014
(Continued)

*Primary Examiner* — Patrick Assouad
*Assistant Examiner* — Haidong Zhang
(74) *Attorney, Agent, or Firm* — Womble Bond Dickinson (US) LLP

(57) ABSTRACT

Embodiments of a degradation phenomenon treatment method based on a photovoltaic module and a related device are disclosed. A high frequency signal is applied to the photovoltaic module when a degradation phenomenon occurs in the photovoltaic module to protect the photovoltaic module and suppress or eliminate the degradation phenomenon. The degradation phenomenon refers to degradation of electricity generation efficiency of the photovoltaic module under effect of an electric potential. Embodiments of the degradation phenomenon treatment method and the device resolve issues associated with a declined electrical energy conversion capability and decreased electricity generation efficiency of a photovoltaic module caused by a surface polarization phenomenon, a potential induced degradation (PID) phenomenon occurring in the photovoltaic module, or both.

17 Claims, 11 Drawing Sheets

(56) References Cited

U.S. PATENT DOCUMENTS

| | | | |
|---|---|---|---|
| 2009/0217964 A1* | 9/2009 | Gilmore | H01L 31/02021 |
| | | | 136/244 |
| 2013/0201027 A1 | 8/2013 | Bucher | |
| 2015/0207456 A1 | 7/2015 | Han et al. | |
| 2017/0047888 A1 | 2/2017 | Swanson et al. | |

FOREIGN PATENT DOCUMENTS

| | | |
|---|---|---|
| CN | 203813731 U | 9/2014 |
| CN | 104201715 A | 12/2014 |
| CN | 204258328 U | 4/2015 |
| CN | 106656023 A | 5/2017 |
| CN | 108649099 A | 10/2018 |
| EP | 3004907 A1 | 4/2016 |
| WO | 2018049277 A1 | 3/2018 |

\* cited by examiner

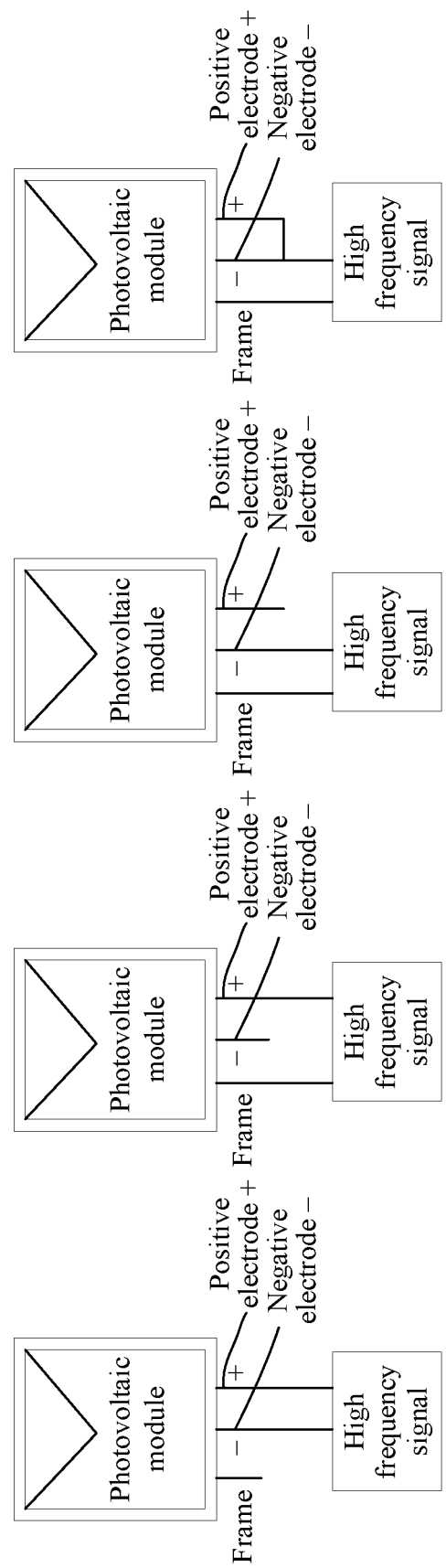

DEGRADATION PHENOMENON TREATMENT METHOD BASED ON PHOTOVOLTAIC MODULE, AND RELATED DEVICE

CROSS-REFERENCE TO RELATED APPLICATIONS

This application is a continuation of International Application No. PCT/CN2019/084518, filed on Apr. 26, 2019, which claims priority to Chinese Patent Application No. 201810397532.1, filed on Apr. 27, 2018. The disclosures of the aforementioned applications are hereby incorporated by reference in their entireties

TECHNICAL FIELD

Embodiments of the invention relates to the field of semiconductor optoelectronic technologies, and in particular, to a degradation phenomenon treatment method based on a photovoltaic module, and a related device.

BACKGROUND

A potential induced degradation (PID) refers to a potential induced degradation. When a photovoltaic module has been long affected by a negative bias voltage, metal ion (positive charge) migration occurs between glass and a packaging material, resulting in performance degradation of the photovoltaic module. This phenomenon is referred to as a PID phenomenon. For example, when a large quantity of metal ions (e.g., sodium ions) in the glass migrate into a PN junction of the photovoltaic module, causing the PN junction to be electrically on, the photovoltaic module loses its capability of electrical energy conversion, severely affecting electricity generation efficiency of the photovoltaic module.

Correspondingly, longtime exposure of the photovoltaic module to a positive bias voltage results in presence of a leakage current between the glass and the packaging material. As a result, a large quantity of negative charges accumulate on a surface (e.g., at a silicon nitride layer of the surface) of the photovoltaic module, attracting electron holes to recombine with the negative charges (e.g., electrons) on the surface, thereby leading to a surface polarization phenomenon of the photovoltaic module.

For ease of description of this application, the PID phenomenon and the surface polarization phenomenon are collectively referred to as degradation phenomena. It is found in practice that, when the degradation phenomenon (e.g., the PID phenomenon, the surface polarization phenomenon, or both the PID phenomenon and the surface polarization phenomenon) occurs in a photovoltaic module, electricity generation efficiency of the photovoltaic module is severely affected and an electrical energy conversion capability of the photovoltaic module is degraded.

SUMMARY

Embodiments of the invention disclose a degradation phenomenon treatment method and a related device, to resolve prior-art problems such as a declined electrical energy conversion capability and decreased electricity generation efficiency of a photovoltaic module when a degradation phenomenon (e.g., a surface polarization phenomenon, a PID phenomenon, or both the surface polarization phenomenon and the PID phenomenon) occurs in the photovoltaic module.

According to a first aspect, an embodiment of the invention provides a degradation phenomenon treatment method based on a photovoltaic module. The method includes:
applying a high frequency signal to the photovoltaic module when a degradation phenomenon occurs in the photovoltaic module, enabling charges accumulating in the photovoltaic module to be released, so as to protect the photovoltaic module and suppress or eliminate the degradation phenomenon, where the degradation phenomenon refers to degradation of electricity generation efficiency of the photovoltaic module when charges accumulate in the photovoltaic module under effect of an electric potential.

In some possible embodiments, the degradation phenomenon includes a surface polarization phenomenon and a potential induced degradation (PID) phenomenon. The surface polarization phenomenon refers to accumulation of a large quantity of negative charges on a surface of the photovoltaic module under effect of a positive bias voltage, and the PID phenomenon refers to migration of metal ions in glass of the photovoltaic module under effect of a negative bias voltage.

In some possible embodiments, when the degradation phenomenon is the surface polarization phenomenon, the high frequency signal is applied to the photovoltaic module to excite the negative charges accumulating on the surface of the photovoltaic module into the photovoltaic module, so as to suppress the surface polarization phenomenon of the photovoltaic module; and when the degradation phenomenon is the PID phenomenon, the high frequency signal is applied to the photovoltaic module to make the metal ions in the glass of the photovoltaic module stay inside the glass, so as to suppress the PID phenomenon of the photovoltaic module.

In some possible embodiments, the applying a high frequency signal to the photovoltaic module includes at least one of the following:
applying the high frequency signal between a positive electrode and a negative electrode of the photovoltaic module;
if the photovoltaic module includes a frame, applying the high frequency signal between the positive electrode and the frame of the photovoltaic module;
if the photovoltaic module includes a frame, applying the high frequency signal between the negative electrode and the frame of the photovoltaic module; or if the photovoltaic module includes a frame and the positive electrode and the negative electrode of the photovoltaic module are short-circuited, applying the high frequency signal between the negative electrode and the frame of the photovoltaic module.

In some possible embodiments, the high frequency signal is a signal with a frequency exceeding a first threshold, where the high frequency signal includes at least one of the following: an alternating-current signal, a direct-current signal, an electric wave signal, an electromagnetic wave signal, a light wave signal, or a sound wave signal. Optionally, the high frequency signal may be an alternating-current signal or a combination of an alternating-current signal and a direct-current signal.

In some possible embodiments, the applying a high frequency signal to the photovoltaic module includes: electrically connecting a signal generator corresponding to the high frequency signal to the positive electrode, the negative electrode, and the frame of the photovoltaic module randomly based on a user demand. For example, when the surface polarization phenomenon occurs in the photovoltaic module, a positive electrode of the signal generator corresponding to the high frequency signal is electrically connected to the frame of the photovoltaic module, and a negative electrode of the signal generator corresponding to the high frequency signal is electrically connected to a first electrode of the photovoltaic module; or a positive electrode of the signal generator corresponding to the high frequency signal is electrically connected to the negative electrode of the photovoltaic module, and a negative electrode of the signal generator corresponding to the high frequency signal is electrically connected to the positive electrode of the photovoltaic module. When the PID phenomenon occurs in the photovoltaic module, the positive electrode of the signal generator corresponding to the high frequency signal is electrically connected to the first electrode of the photovoltaic module, and the negative electrode of the signal generator corresponding to the high frequency signal is electrically connected to the frame of the photovoltaic module; or the positive electrode of the signal generator corresponding to the high frequency signal is electrically connected to the positive electrode of the photovoltaic module, and the negative electrode of the signal generator corresponding to the high frequency signal is electrically connected to the negative electrode of the photovoltaic module. The first electrode includes any one of the following: the positive electrode of the photovoltaic module, the negative electrode of the photovoltaic module, and the negative electrode after the positive electrode and the negative electrode of the photovoltaic module are short-circuited.

In some possible embodiments, the high frequency signal generates m energy levels in the photovoltaic module, enabling electrons and electron holes to jump between the m energy levels when the photovoltaic module is exposed to light, thereby prolonging life spans of the electrons and the electron holes (also referred to as charge carriers), reducing a probability of recombination of the electrons and the electron holes and increasing the electricity generation efficiency of the photovoltaic module, where m is a positive integer.

In some possible embodiments, a frequency of the high frequency signal ranges from 0.1 MHz to 100 THz (comprising 0.1 MHz and 100 THz).

In some possible embodiments, an amplitude of the high frequency signal ranges from 0.1 V to 1 kV (comprising 0.1 V and 1 kV).

According to a second aspect, an embodiment of the invention provides a photovoltaic module, where the photovoltaic module includes a corresponding functional device configured to perform the method described in the first aspect.

In some possible embodiments, the photovoltaic module includes glass, a negative electrode, a filling material EVA, an anti reflective coating ARC, an N-type substrate, a PN junction, a P-type substrate, and a positive electrode.

According to a third aspect, an embodiment of the invention provides a degradation phenomenon treatment apparatus based on a photovoltaic module. The apparatus includes a photovoltaic module and a signal generator, where
  the signal generator is configured to generate a high frequency signal; and
  the signal generator is further configured to apply the high frequency signal to the photovoltaic module when a degradation phenomenon occurs in the photovoltaic module, enabling charges accumulating in the photovoltaic module to be released, so as to protect the photovoltaic module and suppress or eliminate the degradation phenomenon, where the degradation phenomenon refers to degradation of electricity generation efficiency of the photovoltaic module when charges accumulate in the photovoltaic module under effect of an electric potential.

In some possible embodiments, the apparatus further includes a controller, where the controller is configured to adjust, based on an obtained first signal, the high frequency signal generated by the signal generator, so that the degradation phenomenon is suppressed or eliminated after the high frequency signal is applied to the photovoltaic module, where the first signal is an open-circuit signal, a short-circuit signal or an output-power signal between a positive electrode and a negative electrode of the photovoltaic module.

In some possible embodiments, the high frequency signal is obtained when the first signal is a target signal, where the target signal is any one of the following: a maximum open-circuit signal, a maximum short-circuit signal, and a maximum output-power signal, where
  the maximum open-circuit signal is a maximum voltage signal or a maximum current signal between the positive electrode and the negative electrode of the photovoltaic module when the positive electrode and the negative electrode of the photovoltaic module are open-circuited; the maximum short-circuit signal is a maximum current signal between the positive electrode and the negative electrode of the photovoltaic module when the positive electrode and the negative electrode of the photovoltaic module are short-circuited; and the maximum output-power signal is a voltage signal or a current signal between the positive electrode and the negative electrode of the photovoltaic module under a maximum output power between the positive electrode and the negative electrode of the photovoltaic module.

In some possible embodiments, the apparatus further includes a coupling and impedance matching circuit, where
  the coupling and impedance matching circuit is configured to transmit the high frequency signal generated by the signal generator, so as to apply the high frequency signal to the photovoltaic module.

In some possible embodiments, the apparatus further includes a decoupling circuit, where
  the decoupling circuit is configured to filter an electrical energy signal generated by the photovoltaic module to obtain a direct-current signal generated by the photovoltaic module.

In some possible embodiments, the apparatus further includes an inverter, where
  the inverter is configured to convert the direct-current signal generated by the photovoltaic module to obtain an alternating-current signal generated by the photovoltaic module, which is transmitted to a power grid to supply power.

In some possible embodiments, the degradation phenomenon includes a surface polarization phenomenon and a potential induced degradation (PID) phenomenon, where the surface polarization phenomenon refers to accumulation of a large quantity of negative charges on a surface of the photovoltaic module under effect of a positive bias voltage, and the PID phenomenon refers to migration of metal ions in glass of the photovoltaic module under effect of a negative bias voltage; where
  when the degradation phenomenon is the surface polarization phenomenon, the high frequency signal is applied to the photovoltaic module to excite the negative charges accumulating on the surface of the photovoltaic module into the photovoltaic module, so as to suppress the surface polarization phenomenon of the photovoltaic module; and when the degradation phenomenon is the PID phenomenon, the high frequency signal is applied to the photovoltaic module to make the metal ions in the glass of the photovoltaic module stay inside the glass, so as to suppress the PID phenomenon of the photovoltaic module.

In some possible embodiments, the applying the high frequency signal to the photovoltaic module includes at least one of the following:

applying the high frequency signal between the positive electrode and the negative electrode of the photovoltaic module;

if the photovoltaic module includes a frame, applying the high frequency signal between the positive electrode and the frame of the photovoltaic module;

if the photovoltaic module includes a frame, applying the high frequency signal between the negative electrode and the frame of the photovoltaic module; or if the photovoltaic module includes a frame and the positive electrode and the negative electrode of the photovoltaic module are short-circuited, applying the high frequency signal between the negative electrode and the frame of the photovoltaic module.

In some possible embodiments, the high frequency signal is a signal with a frequency exceeding a first threshold, where the high frequency signal includes an alternating-current signal or an alternating-current signal and a direct-current signal.

In some possible embodiments, the high frequency signal generates m energy levels in the photovoltaic module, enabling electrons and electron holes to jump between the m energy levels when the photovoltaic module is exposed to light, thereby reducing a probability of recombination of the electrons and the electron holes and increasing the electricity generation efficiency of the photovoltaic module, where m is a positive integer.

In some possible embodiments, a frequency of the high frequency signal ranges from 0.1 MHz to 100 THz (comprising 0.1 MHz and 100 THz).

In some possible embodiments, an amplitude of the high frequency signal ranges from 0.1 V to 1 kV (comprising 0.1 V and 1 kV).

According to the embodiments of the invention, prior-art problems can be resolved, such as a declined electrical energy conversion capability and decreased electricity generation efficiency of a photovoltaic module caused by a degradation phenomenon (e.g., a surface polarization phenomenon a PID phenomenon, or both the surface polarization phenomenon and the PID phenomenon) occurring in the photovoltaic module.

BRIEF DESCRIPTION OF DRAWINGS

To describe the technical solutions in the embodiments of the invention more clearly, the following briefly describes the accompanying drawings required for describing the embodiments.

FIG. 4A to FIG. 4D are schematic diagrams of applying a high frequency voltage to a photovoltaic module according to an embodiment of the invention;

DESCRIPTION OF EMBODIMENTS

The following describes the technical solutions in the embodiments of the invention in detail with reference to the accompanying drawings.

Figure 1:
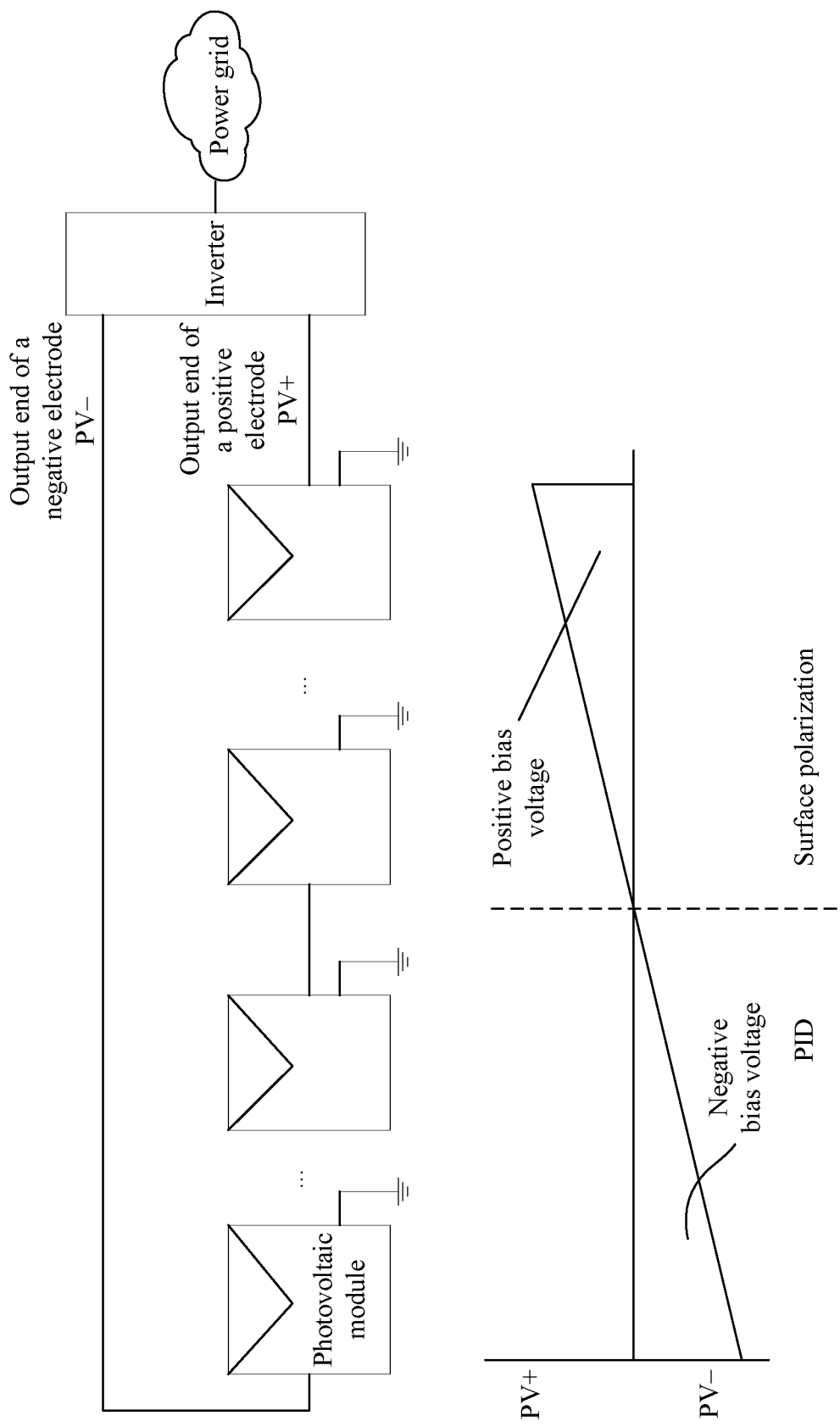
FIG. 1 is a schematic diagram of electricity generation based on photovoltaic modules according to an embodiment of the invention.

In the process of filing this application, it is found that a PID phenomenon occurs in a photovoltaic module under a negative bias voltage, and a surface polarization phenomenon occurs in a photovoltaic module under a positive bias voltage. FIG. 1 is a schematic diagram of an electricity generation system based on photovoltaic modules according to an embodiment of the invention. As shown in FIG. 1, typically a frame of a photovoltaic module is grounded, causing a bias voltage to be formed between the single photovoltaic module and the frame. In addition, as shown in FIG. 1, for a photovoltaic module closer to an output end of a negative electrode, a PID phenomenon that occurs under effect of a negative bias voltage is more obvious; for a photovoltaic module closer to an output end of a positive electrode, a surface polarization phenomenon that occurs under effect of a positive bias voltage is more obvious.

Figure 2:
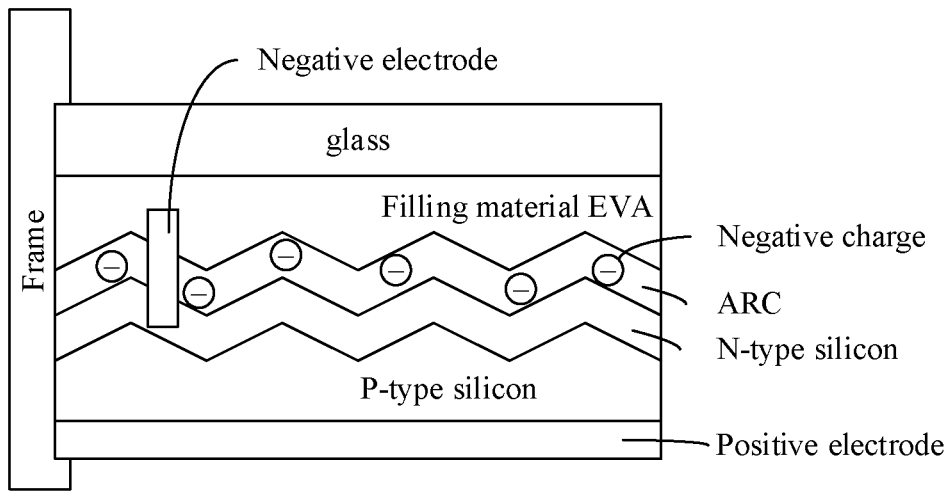
FIG. 2 is a schematic structural diagram of a photovoltaic module with a frame according to an embodiment of the invention.

The following uses a surface polarization phenomenon occurring in a photovoltaic module as an example to describe a principle of occurrence of the surface polarization phenomenon. In at least some embodiments, each photovoltaic module typically includes a plurality of photovoltaic cells (e.g., solar cell units). For example, a photovoltaic module may include 60, 72 photovoltaic cells, or any other number of photovoltaic cells. FIG. 2 is a schematic structural diagram of a photovoltaic module with a frame, and a schematic structural diagram of a photovoltaic cell located on the frame according to an embodiment of the invention. The photovoltaic module (e.g., the solar cell unit in the module) includes glass, a positive electrode (also referred to as an upper electrode), a filling material ethylene vinyl acetate (EVA), an antireflective coating (ARC), an N-type substrate, a P-type substrate, a PN junction, and a negative electrode (also referred to as a lower electrode). Both the N-type substrate and the P-type substrate are silicon substrates. A material of the silicon substrate includes but is not limited to monocrystalline silicon and polycrystalline silicon. N-type silicon and P-type silicon are shown in the FIG. 2. The anti-reflective coating ARC mainly includes a silicon nitride layer and a silicon dioxide layer. For a material of the ARC, details are not described herein. The positive electrode locates below the P-type substrate. The negative electrode locates between the N-type substrate and the filling material EVA, and is connected to the N-type substrate after penetrating the anti reflective coating ARC. Optionally, a thickness of the photovoltaic module in this application may be less than or equal to 300 micrometers (μm), or a thickness of the photovoltaic module may not be limited. For a manufacturing material and a manufacturing process related to the photovoltaic module, details are not described in this application.

Figure 3:
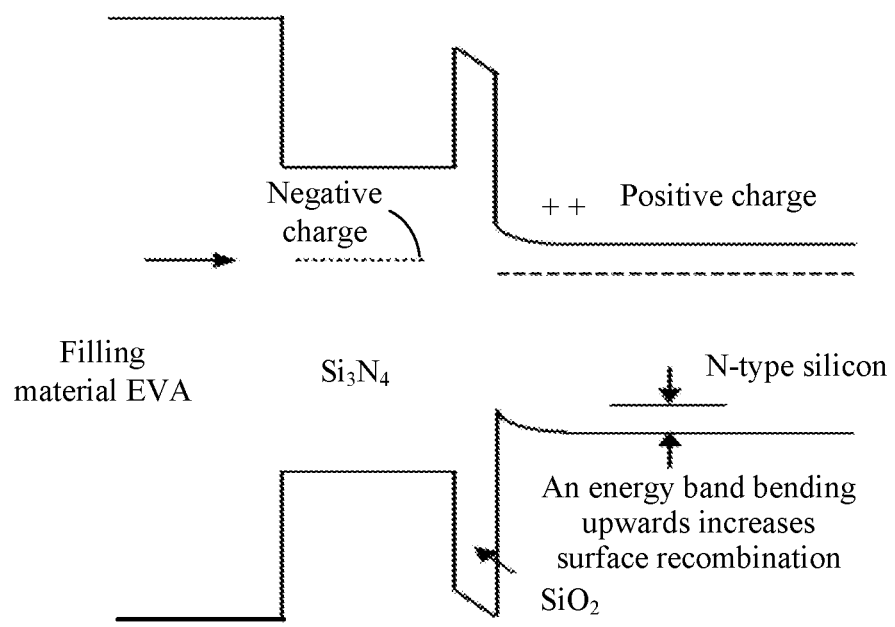
FIG. 3 is a schematic diagram of an energy band of a negative charge motion according to an embodiment of the invention.

The photovoltaic module shown in FIG. 2 typically generates electricity outdoors for a long time, and is likely to be affected by factors such as temperature, humidity, and deviation. As a result, performance of the photovoltaic module degrades. For example, a leakage current occurs in the photovoltaic module under effect of a positive bias voltage, and the leakage current flows from the negative electrode through the EVA, the glass surface and the frame to the earth. To be specific, under the effect of the leakage current, a positively charged charge carrier flows through the glass, and passes through the frame to the earth, making negative charges accumulate on a surface of a cell, attracting electron holes to a surface of the photovoltaic module to recombine with electrons (negative charges), rather than letting the electron holes flow to the P-type silicon when electricity generation is normal. For details, refer to a diagram of an energy band of a negative charge motion shown in FIG. 3. As shown in FIG. 3, the anti reflective coating ARC includes a silicon nitride layer ($Si_3N_4$) and a silicon dioxide layer ($SiO_2$). Breakdown of the silicon nitride is easy, and electric potential of the silicon nitride is relatively low; while breakdown of a filling material and the silicon dioxide is not easy, and electric potentials of the filling material and the silicon dioxide are relatively high. Therefore, a large quantity of negative charges accumulate at the silicon nitride layer, that is, the surface of the photovoltaic module. Because of accumulation of negative charges, electron holes are attracted to the surface of the photovoltaic module, realizing recombination of the electron holes and the electrons (negative charges). This leads to a declined electrical energy conversion capability and decreased electricity generation efficiency of the photovoltaic module. This phenomenon is also referred to as a surface polarization phenomenon.

Similarly, metal ions (positive charges) in the glass migrate towards inside of the photovoltaic module (more specifically, towards the PN junction) under effect of a negative bias voltage. As a result, the metal ions accumulate in the P-type substrate and the PN junction, leading to declined performance and decreased electricity generation efficiency of the photovoltaic module. This phenomenon is also referred to as a PID phenomenon. For how the metal ions migrate under effect of the negative bias voltage, details are not described in this application.

It can be understood that both the surface polarization phenomenon and the PID phenomenon of a photovoltaic module are phenomena of degradation/deterioration of electricity generation efficiency of the photovoltaic module under effect of a bias voltage (electric potential). For ease of description of this patent, the PID phenomenon and the surface polarization phenomenon are collectively referred to as degradation phenomena in this application. In other words, the degradation phenomenon in this application includes a surface polarization phenomenon and a PID phenomenon. For the PID phenomenon and the surface polarization phenomenon, refer to related descriptions in the foregoing embodiments. Details are not described herein again.

To resolve the foregoing problems, this application provides a degradation phenomenon treatment method based on a photovoltaic module and an apparatus to which the method is applicable. Embodiments related to the degradation phenomenon treatment method based on a photovoltaic module are first described. In an embodiment, this application proposes that a high frequency signal is applied to the photovoltaic module without changing a structure of the photovoltaic module, so as to protect the photovoltaic module and suppress or eliminate a degradation phenomenon of the photovoltaic module. There are two solutions in an implementation.

In a first solution, when a surface polarization phenomenon occurs in the photovoltaic module (e.g., the degradation phenomenon is the surface polarization phenomenon), a high frequency signal may be applied to the photovoltaic module to excite negative charges accumulating on a surface of the photovoltaic module into the photovoltaic module (e.g., an N-type substrate), so as to suppress/eliminate the surface polarization phenomenon of the photovoltaic module.

In a second solution, when a PID phenomenon occurs in the photovoltaic module (e.g., the degradation phenomenon is the PID phenomenon), a high frequency signal may be applied to the photovoltaic module to make metal ions in glass of the photovoltaic module skip migrating and stay in the glass, so as to suppress/eliminate the PID phenomenon of the photovoltaic module.

The high frequency signal refers to a signal with a frequency exceeding a first threshold.

The first threshold herein may be defined on a user side or a system side, for example, 50 megahertz (MHz). A representation form of the high frequency signal is not limited in this application. For example, the high frequency signal may include but is not limited to any one or any combination of the following: an alternating-current signal, a direct-current signal, an electric wave signal, an electromagnetic wave signal, a light wave signal, a sound wave signal, and a signal in another representation form.

It should be understood that the alternating-current signal, the direct-current signal, the electric wave signal, and the electromagnetic wave signal are all electric signals, and may be present as voltages or currents. In other words, when the high frequency signal is the electric signal, a high frequency voltage or a high frequency current may be applied to the photovoltaic module. In actual application, the light wave signal may be present as a ray, for example, an X-ray or a γ-ray. The sound wave signal may be present as a sound wave, for example, an ultrasonic wave. Because a form of the high frequency signal varies in actual application, the following mainly uses an electric signal as an example of the high frequency signal to describe related content in this application.

A manner for applying the high frequency signal to the photovoltaic module may vary with the form of the high frequency signal. Alternatively, a manner for applying high frequency signals in a same form to the photovoltaic module may also vary. The following describes several possible manners of applying the high frequency signal.

In some embodiments, the high frequency signal may be applied between the positive electrode and the negative electrode of the photovoltaic module, as shown in FIG. 4A.

Figure 5A:
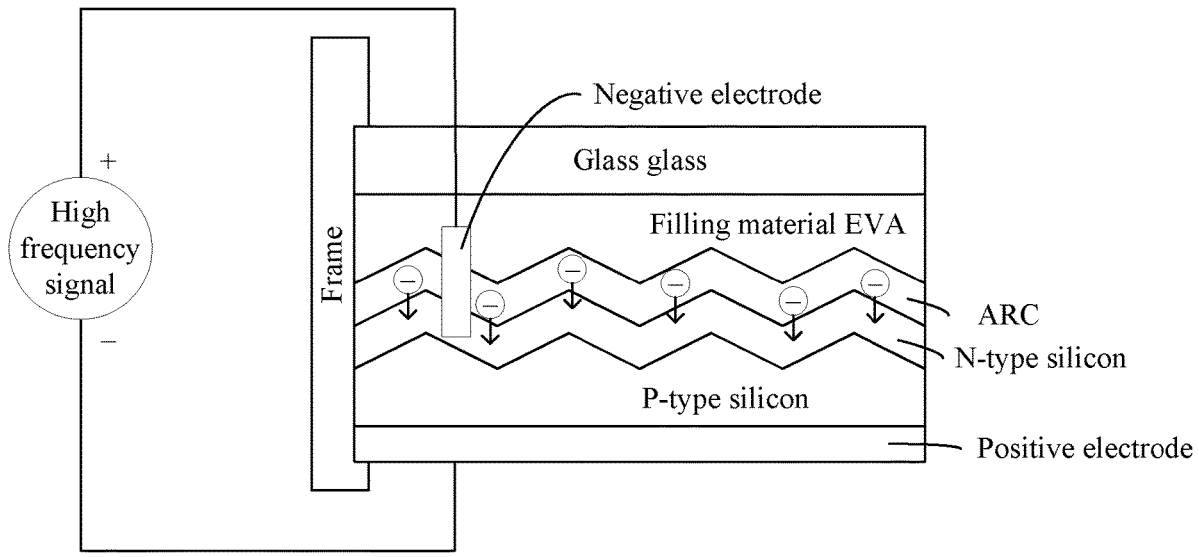
FIG. 5A and FIG. 5B are schematic diagrams of two kinds of charge motions according to an embodiment of the invention.

In an embodiment, in the first solution, when the surface polarization phenomenon occurs in the photovoltaic module, to suppress the surface polarization phenomenon, it is needed to excite the negative charges accumulating on the surface (e.g., silicon nitride layer) of the photovoltaic module into the photovoltaic module. Optionally, to increase the electricity generation efficiency of the photovoltaic module (or to achieve normal electricity generation of the photovoltaic module), it is needed to excite the negative charges into the N-type substrate of the photovoltaic module. Therefore, when the high frequency signal is being applied to the photovoltaic module, a positive electrode and a negative electrode of a signal generator may be electrically connected to the positive electrode and the negative electrode of the photovoltaic module respectively. The positive electrode or the negative electrode of the signal generator may be electrically connected to the positive electrode of the photovoltaic module, and the rest electrodes are electrically connected to each other. For example, as shown in FIG. 5A, the positive electrode of the signal generator may be electrically connected to the negative electrode of the photovoltaic module, and the negative electrode of the signal generator may be electrically connected to the positive electrode of the photovoltaic module. In this way, under effect of an electric field corresponding to the high frequency signal, negative charges are excited into the photovoltaic module, for example, into the N-type substrate. As shown in FIG. 5A, a negative charge is expressed as ⊖.

The signal generator is a device configured to generate the high frequency signal. This device includes but is not limited to a radio remote unit (RRU), a microwave generator, or another device configured to generate the high frequency signal. This is not limited in this application.

Figure 5B:
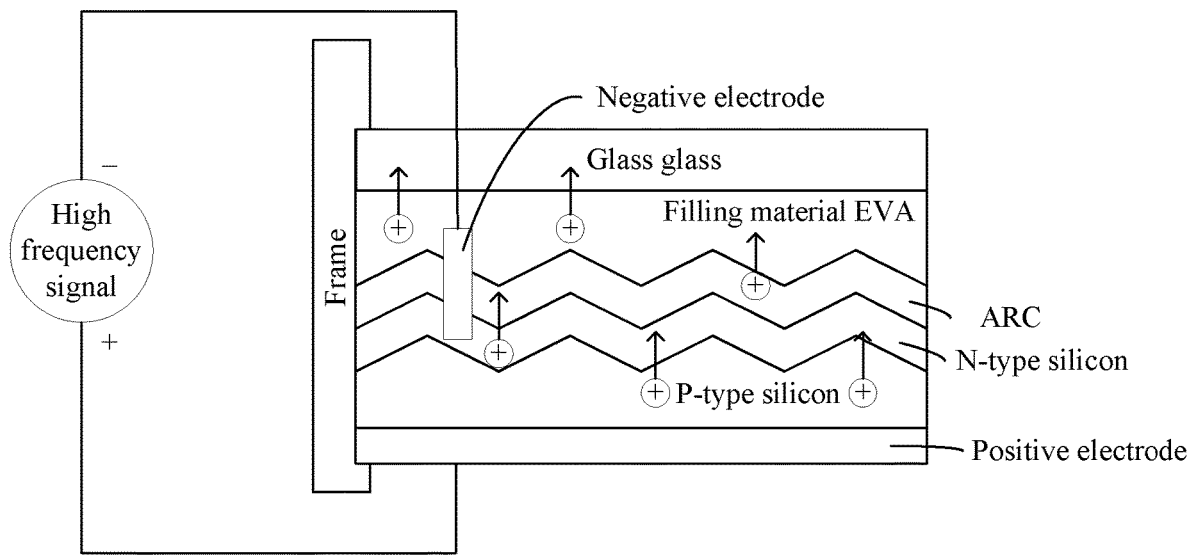

Correspondingly in the second solution, when the PID phenomenon occurs in the photovoltaic module, to suppress the PID phenomenon, it is needed to make the metal ions (positive charges) that migrate in the glass stay inside the glass. Therefore, when the high frequency signal is being applied to the photovoltaic module, the positive electrode and the negative electrode of the signal generator may be electrically connected to the positive electrode and the negative electrode of the photovoltaic module respectively. The positive electrode or the negative electrode of the signal generator may be electrically connected to the positive electrode of the photovoltaic module, and the rest electrodes are electrically connected to each other. For example, as shown in FIG. 5B, the positive electrode of the signal generator may be electrically connected to the positive electrode of the photovoltaic module, and the negative electrode of the signal generator may be electrically connected to the negative electrode of the photovoltaic module. Under effect of the electric field of the high frequency signal, the positive charges that migrate in the glass remigrate and stay inside the glass.

As shown in FIG. 5B, a positive charge is expressed as ⊕.

In still some embodiments, when the photovoltaic module is designed with/includes a frame, the high frequency signal may be applied between the positive electrode and the frame of the photovoltaic module, as shown in FIG. 4B.

In an embodiment, in the first solution, when the surface polarization phenomenon occurs in the photovoltaic module, and when the high frequency signal is being applied to the photovoltaic module, the positive electrode and the negative electrode of the signal generator may be electrically connected to the positive electrode and the frame of the photovoltaic module respectively. The positive electrode or the negative electrode of the signal generator may be electrically connected to the positive electrode of the photovoltaic module, and the rest electrode of the signal generator is electrically connected to the frame. For example, the positive electrode of the signal generator may be electrically connected to the frame of the photovoltaic module, and the negative electrode of the signal generator may be electrically connected to the positive electrode of the photovoltaic module. For the signal generator and a principle of how the negative charges migrate into the photovoltaic module, refer to related description in the foregoing embodiments. Details are not described herein again.

In the second solution, when the PID phenomenon occurs in the photovoltaic module, and when the high frequency signal is being applied to the photovoltaic module, the positive electrode and the negative electrode of the signal generator may be electrically connected to the positive electrode and the frame of the photovoltaic module respectively. The positive electrode or the negative electrode of the signal generator may be electrically connected to the positive electrode of the photovoltaic module, and the rest electrode of the signal generator is electrically connected to the frame. For example, the positive electrode of the signal generator may be electrically connected to the positive electrode of the photovoltaic module, and the negative electrode of the signal generator may be electrically connected to the frame of the photovoltaic module. For the signal generator and a principle of how the metal ions (positive charges) migrate and stay inside the glass, refer to related description in the foregoing embodiments. Details are not described herein again.

In still some embodiments, when the photovoltaic module is designed with/includes a frame, the high frequency signal may be further applied between the negative electrode and the frame of the photovoltaic module, as shown in FIG. 4C.

In an embodiment, in the first solution, when the surface polarization phenomenon occurs in the photovoltaic module, and when the high frequency signal is being applied to the photovoltaic module, the positive electrode and the negative electrode of the signal generator may be electrically connected to the negative electrode and the frame of the photovoltaic module respectively. The positive electrode or the negative electrode of the signal generator may be electrically connected to the negative electrode of the photovoltaic module, and the rest electrodes are electrically connected to each other. For example, the positive electrode of the signal generator may be electrically connected to the frame of the photovoltaic module, and the negative electrode of the signal generator may be electrically connected to the negative electrode of the photovoltaic module. For the signal generator and a principle of how the negative charges migrate into the photovoltaic module, refer to related description in the foregoing embodiments. Details are not described herein again.

In the second solution, when the PID phenomenon occurs in the photovoltaic module, and when the high frequency signal is being applied to the photovoltaic module, the positive electrode and the negative electrode of the signal generator may be electrically connected to the negative electrode and the frame of the photovoltaic module respectively. The positive electrode or the negative electrode of the signal generator may be electrically connected to the negative electrode of the photovoltaic module, and the rest electrodes are electrically connected to each other. For example, the positive electrode of the signal generator may be electrically connected to the negative electrode of the photovoltaic module, and the negative electrode of the signal generator may be electrically connected to the frame of the photovoltaic module. For the signal generator and a principle of how the metal ions (positive charges) migrate and stay inside the glass, refer to related description in the foregoing embodiments. Details are not described herein again.

In still some embodiments, when the positive electrode and the negative electrode of the photovoltaic module are short-circuited, the high frequency signal may be further applied between the frame of the photovoltaic module and the short-circuited positive/negative electrode, as shown in FIG. 4D.

In an embodiment, in the first solution, when the surface polarization phenomenon occurs in the photovoltaic module, and when the high frequency signal is being applied to the photovoltaic module, the positive electrode and the negative electrode of the signal generator may be electrically connected to the negative electrode and the frame of the photovoltaic module respectively after the positive electrode and the negative electrode of the photovoltaic module are short-circuited. The positive electrode or the negative electrode of the signal generator may be electrically connected to either of the short-circuited positive electrode and the short-circuited negative electrode of the photovoltaic module, and the rest electrode of the signal generator is electrically connected to the frame. For example, the positive electrode of the signal generator may be electrically connected to the frame of the photovoltaic module, and the negative electrode of the signal generator may be electrically connected to either of the short-circuited positive electrode and the short-circuited negative electrode (for example, the short-circuited positive electrode or the short-circuited negative electrode) of the photovoltaic module. For the signal generator and a principle of how the negative charges migrate into the photovoltaic module, refer to related description in the foregoing embodiments. Details are not described herein again.

In the second solution, when the PID phenomenon occurs in the photovoltaic module, and when the high frequency signal is being applied to the photovoltaic module, the positive electrode and the negative electrode of the signal generator may be electrically connected to the negative electrode and the frame of the photovoltaic module respectively after the positive electrode and the negative electrode of the photovoltaic module are short-circuited. The positive electrode or the negative electrode of the signal generator may be electrically connected to either of the short-circuited positive electrode and the short-circuited negative electrode of the photovoltaic module, and the rest electrode of the signal generator is electrically connected to the frame. For example, the positive electrode of the signal generator may be electrically connected to either of the short-circuited positive electrode and the short-circuited negative electrode (for example, the short-circuited positive electrode or the short-circuited negative electrode) of the photovoltaic module, and the negative electrode of the signal generator may be electrically connected to the frame of the photovoltaic module. For the signal generator and a principle of how the metal ions (positive charges) migrate and stay inside the glass, refer to related description in the foregoing embodiments. Details are not described herein again.

In still some embodiments, the high frequency signal may be applied to the photovoltaic module. For example, when the high frequency signal is a light wave signal or a sound wave signal, a ray (for example, an X-ray or a γ-ray) corresponding to the light wave signal or a sound wave (for example, an ultrasonic wave) corresponding to the sound wave signal may be directly applied to the surface of the photovoltaic module. For principles of how the negative charges and the positive charges migrate to suppress the degradation phenomenon of the photovoltaic module in the foregoing two solutions, refer to related descriptions in the foregoing embodiments. Details are not described herein.

The following describes some optional embodiments related to this application.

In an optional embodiment, the high frequency signal exists mainly as an alternating-current signal or a combination of an alternating-current signal and a direct-current signal. In an embodiment, in actual application, an alternating-current voltage or a combination of an alternating-current voltage and a bias voltage (e.g., a direct-current voltage) may be applied to the photovoltaic module. For how these voltages are applied to the photovoltaic module, refer to related descriptions in the foregoing embodiments. Details are not described herein again.

Figure 6:
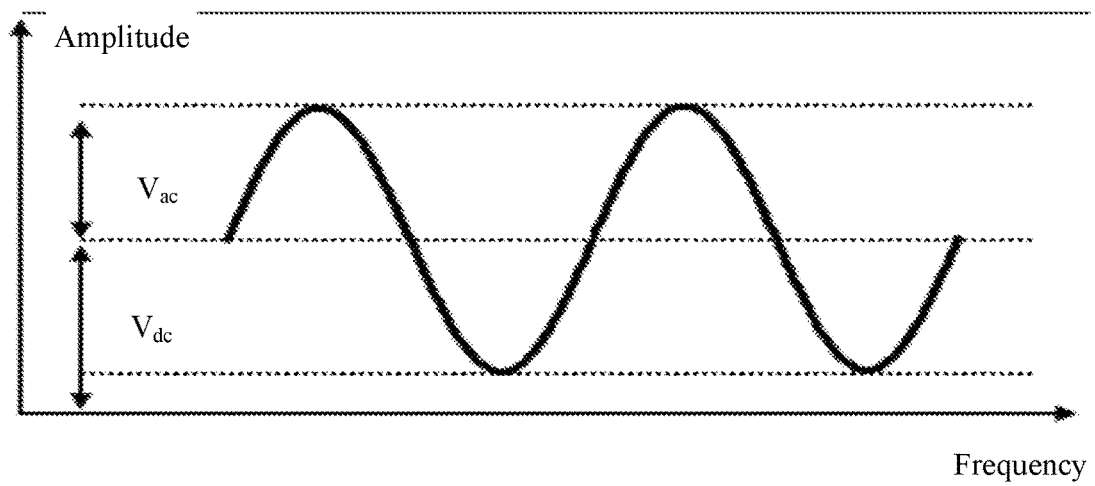
FIG. 6 is a schematic diagram of a waveform of a high frequency signal according to an embodiment of the invention.

A waveform, a frequency, and an amplitude value (also referred to as an amplitude) of the high frequency signal are not limited in this application. For example, a waveform of the high frequency signal may include but is not limited to a sine wave, a square wave, a triangular wave, a sawtooth wave, or another regular or irregular waveform. The sine wave is used as an example. FIG. 6 is a schematic waveform diagram of a high frequency signal according to an embodiment of the invention.

A frequency of the high frequency signal may fall within a first preset range. An upper limit value and a lower limit value of the first preset range may be defined on a user side or a system side. For example, the frequency of the high frequency signal may range from 0.1 MHz to 100 THz (comprising 0.1 MHz and 100 THz). Optionally, the frequency of the high frequency signal may range from tens of MHz to GHz, or even to THz.

An amplitude of the high frequency signal may fall within a second preset range. An upper limit value and a lower limit value of the second preset range may be defined on a user side or a system side. For example, the amplitude of the high frequency signal may range from 0.1 V to 1 kV (comprising 0.1 V and 1 kV). Optionally, the amplitude of the high frequency signal may range from 100 millivolts to several volts. In an optional embodiment, an application time for applying the high frequency signal to the photovoltaic module is not limited in this application. For example, the high frequency signal may be applied to the photovoltaic module at any time according to a demand of the photovoltaic module or a user, to suppress the degradation phenomenon in the photovoltaic module. Optionally, the high frequency signal may be applied at night (e.g., when the photovoltaic module is idle) without decreasing electricity generation duration of the photovoltaic module.

In an optional embodiment, after the high frequency signal is applied to the photovoltaic module, m energy levels (also referred to as metastable energy levels) may be generated in the photovoltaic module, enabling electrons and electron holes (also referred to as charge carriers) to jump between the m metastable energy levels when the photovoltaic module is exposed to light, thereby prolonging life spans of the electrons and the electron holes, reducing a probability of their recombination, and promoting/increasing electricity generation efficiency of the photovoltaic module. Here, m is a positive integer.

Figure 7A:
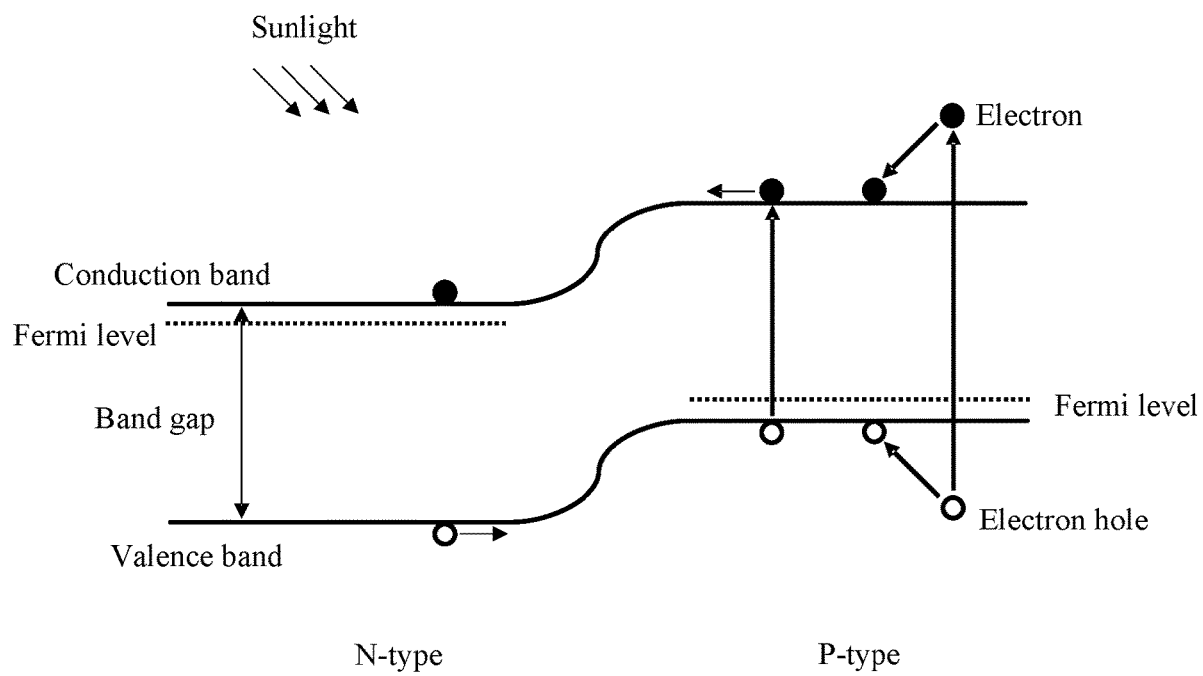
FIG. 7A and FIG. 7B are two schematic diagrams of a negative charge jumping between energy levels according to an embodiment of the invention.
Figure 7B:
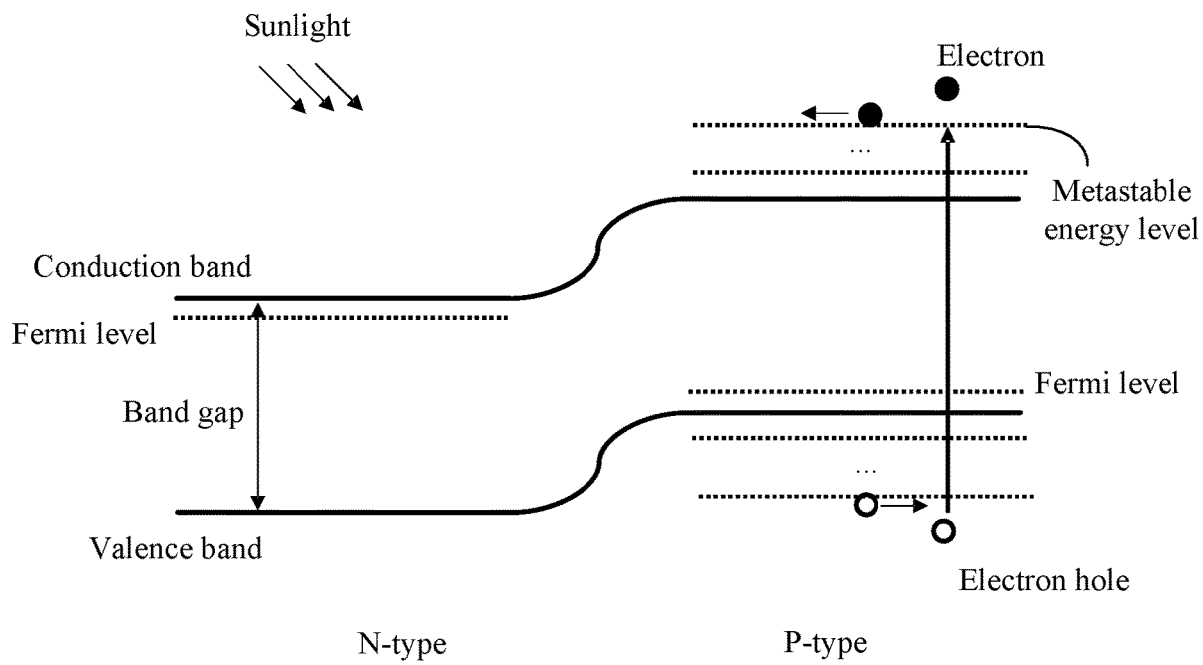

In an embodiment, when the photovoltaic module is exposed to light, it may absorb energy of incident photons, and electron-hole pairs are generated inside the photovoltaic module. Electrons are used as an example. FIG. 7A and FIG. 7B are schematic diagrams of an electron (a negative charge) jumping between different energy levels. When the energy of incident photons absorbed by the photovoltaic module is greater than energy corresponding to a band gap, the electron may jump into a conduction band area (e.g., an area above the bottom of the conduction band), and become a thermoelectron. As shown in FIG. 7A, if no high frequency signal is applied to the photovoltaic module, the metastable energy levels do not exist/are not generated in the conduction band area. When the electron jumps into the conduction band area, because of electro-acoustical coupling effect, the electron quickly cools down to the bottom of the conduction band, and then possibly recombines with the electron hole, leading to declined electricity generation efficiency of the photovoltaic module. As shown in FIG. 7B, if the high frequency signal is applied to the photovoltaic module, one or more metastable energy levels may be generated in the conduction band area. When the electron jumps into the conduction band area, the electron may temporarily stay at the metastable energy levels. This can prolong the life span of the electron, decrease the probability of recombination of the electron and the electron hole, and increase a cooling time of the thermoelectron. Compared with the prior art that only Fermi levels are included, applying the high frequency signal to the photovoltaic module prolongs a time for the electron to stay at each energy level, and increases utilization of sunlight, thereby increasing the electricity generation efficiency of the photovoltaic module.

According to the embodiments of the invention, prior-art problems can be resolved, such as a declined electrical energy conversion capability and decreased electricity generation efficiency of a photovoltaic module caused by a degradation phenomenon (e.g., a PID phenomenon or a surface polarization phenomenon) occurring in the photovoltaic module.

Figure 8:
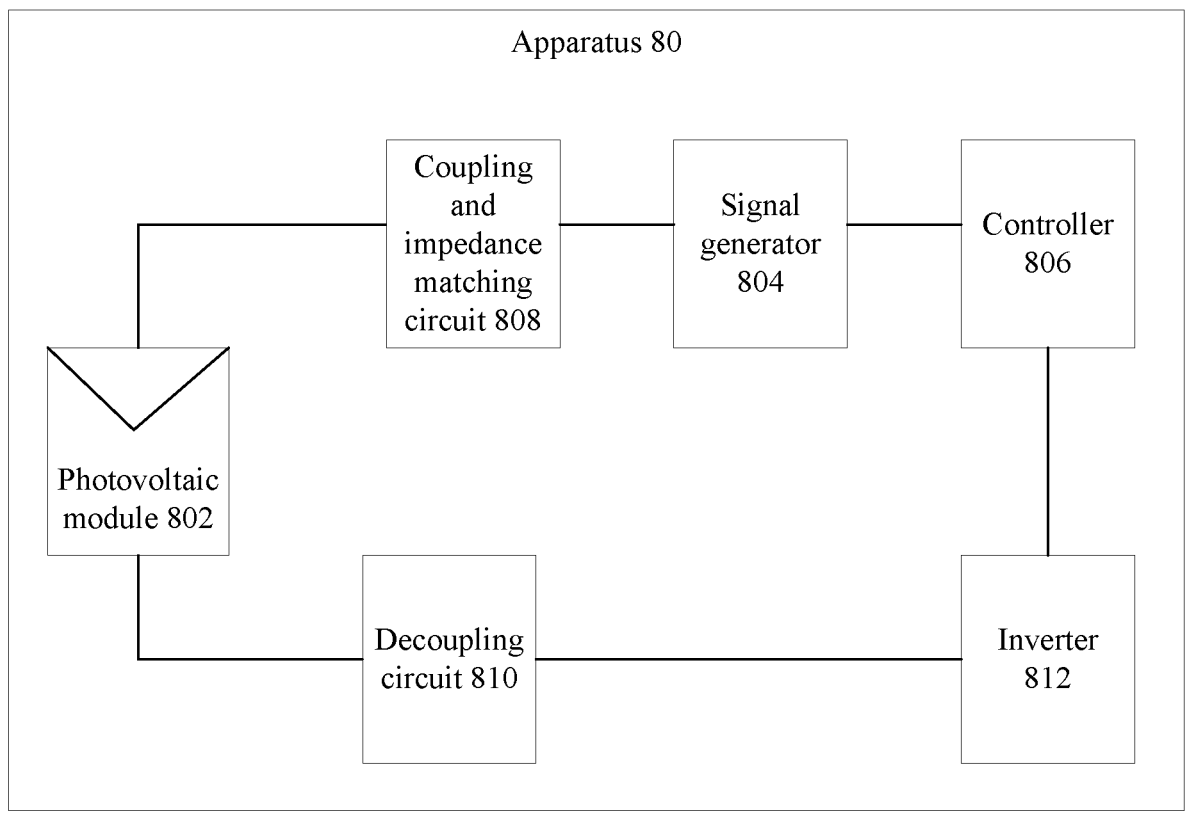
FIG. 8 is a schematic structural diagram of a degradation phenomenon treatment apparatus based on a photovoltaic module according to an embodiment of the invention.

With reference to the foregoing embodiments, the following describes an apparatus to which this application is applicable. FIG. 8 shows a degradation phenomenon treatment apparatus based on a photovoltaic module provided by an embodiment of the invention. The apparatus 80 shown in FIG. 8 may include a photovoltaic module 802 and a signal generator 804. Optionally, the apparatus may further include a controller 806, a coupling and impedance matching circuit 808, a decoupling circuit 810, and an inverter 812.

The signal generator 804 is configured to generate a high frequency signal.

The signal generator 804 is further configured to apply the high frequency signal to the photovoltaic module 802 when a degradation phenomenon occurs in the photovoltaic module 802, to protect the photovoltaic module 802 and suppress or eliminate the degradation phenomenon. The degradation phenomenon refers to degradation of electricity generation efficiency of the photovoltaic module under effect of an electric potential.

In an optional embodiment, the apparatus may further include a controller 806. The controller 806 is configured to control or adjust the high frequency signal generated by the signal generator. In an embodiment, the controller 806 may adjust a parameter of the high frequency signal based on an obtained first signal, so as to suppress the degradation phenomenon of the photovoltaic module better and more effectively after the high frequency signal is applied to the photovoltaic module. The parameter of the high frequency signal includes but is not limited to any one or any combination of the following: a frequency, an amplitude, direct-current/bias voltage signal strength (e.g., a bias voltage or bias current value) of the high frequency signal, or another parameter (for example, a phase) affecting the high frequency signal. The first signal is an output signal between a positive electrode and a negative electrode of the photovoltaic module. The signal may include but is not limited to an open-circuit signal, a short-circuit signal, and an output-power signal. In an embodiment, there are several implementations as follows.

In an implementation, when the positive electrode and the negative electrode of the photovoltaic module are open-circuited, the controller 806 may detect and obtain the open-circuit signal (e.g., an open-circuit voltage signal or an open-circuit current signal) output by the positive electrode and negative electrode of the photovoltaic module, and use the open-circuit signal as the first signal. Further, the controller correspondingly adjusts, based on the first signal, the high frequency signal generated by the signal generator. For example, when the high frequency signal is the alternating-current signal, the frequency of the high frequency signal may be kept unchanged at first, and the amplitude of the high frequency signal may be adjusted based on the collected first signal each time. Further, another parameter (e.g., the frequency described herein) of the high frequency signal may be correspondingly adjusted based on variation of the first signal collected each time, to obtain an optimal high frequency signal.

In an optional embodiment, when the open-circuit signal that is output between the positive electrode and the negative electrode of the photovoltaic module and that is obtained by the controller 806 is the strongest (e.g., an open-circuit voltage value or an open-circuit current value may be the largest), the correspondingly obtained high frequency signal is the optimal high frequency signal. In other words, when the first signal is the maximum open-circuit signal, the high frequency signal corresponding to the maximum open-circuit signal is the optimal high frequency signal. It can be understood that subsequently applying the optimal high frequency signal to the photovoltaic module can suppress/ eliminate the degradation phenomenon of the photovoltaic module better and more effectively.

In another implementation, when the positive electrode and the negative electrode of the photovoltaic module are short-circuited, the controller 806 may detect and obtain the short-circuit signal (e.g., a short-circuit current signal) output after the positive electrode and the negative electrode of the photovoltaic module are short-circuited, and use the short-circuit signal as the first signal. Further, the controller correspondingly adjusts, based on the first signal, the high frequency signal generated by the signal generator.

In an optional embodiment, when the short-circuit signal that is output after the positive electrode and the negative electrode of the photovoltaic module is short-circuited and that is obtained by the controller 806 is the strongest (e.g., a short-circuit current value may be the largest), the correspondingly obtained high frequency signal is the optimal high frequency signal. In other words, when the first signal is the maximum short-circuit signal, the high frequency signal corresponding to the maximum short-circuit signal is the optimal high frequency signal. For the optimal high frequency signal and the adjustment of the high frequency signal, refer to related descriptions in the foregoing embodiment. Details are not described herein.

In still another implementation, the controller 806 may detect and obtain the output-power signal between the positive electrode and the negative electrode of the photovoltaic module, and use the output-power signal as the first signal. Further, the controller correspondingly adjusts, based on the first signal, the high frequency signal generated by the signal generator. In other words, the controller obtains the output-power signal between the positive electrode and the negative electrode of the photovoltaic module, and uses the output-power signal as the first signal.

In an optional embodiment, when the output-power signal between the positive electrode and the negative electrode of the photovoltaic module that is obtained by the controller 806 is the strongest (e.g., an output power may be the largest), the correspondingly obtained high frequency signal is the optimal high frequency signal. In other words, when the first signal is the maximum output-power signal, the high frequency signal corresponding to the maximum output-power signal is the optimal high frequency signal. For the optimal high frequency signal and the adjustment of the high frequency signal, refer to related descriptions in the foregoing embodiment. Details are not described herein again.

In an optional embodiment, the apparatus may further include a coupling and impedance matching circuit 808, a decoupling circuit 810, and an inverter 812.

The coupling and impedance matching circuit 808 is configured to transmit the high frequency signal generated by the signal generator, so as to apply the high frequency signal to the photovoltaic module.

To reduce a signal transmission loss, this application particularly uses the coupling and impedance matching circuit to transmit the high frequency signal, so as to apply the high frequency signal to the photovoltaic module. The coupling and impedance matching circuit may include a coupling circuit and an impedance matching circuit. Optionally, when the coupling circuit includes a function of impedance matching, the coupling circuit may be the coupling and impedance matching circuit. The coupling circuit may include but is not limited to any one or any combination of the circuits in the following coupling manners: direct coupling, capacitive coupling, inductance coupling, transformer coupling, and another coupling manner. The impedance matching circuit may include but is not limited to any one or any combination of the following several circuits: an L-type network, a T-type network, a n-type network, and another impedance matching circuit. In actual application, because 5.8 GHz and 2.4 GHz are frequency bands free for civil use, impedance matching is implemented on these two frequency bands in priority in this application. For a circuit implementation of the coupling and impedance matching circuit, details are not described herein in this application.

The decoupling circuit 810 may be configured to perform processing such as filtering and noise reduction on an electrical energy signal output by the photovoltaic module, to correspondingly obtain a direct-current signal generated/output by the photovoltaic module. It should be understood that the photovoltaic module may generate/output the corresponding electrical energy signal when exposed to sunlight. The electrical energy signal may include a high frequency signal, a low frequency signal, or the like. In actual application, a household alternating current typically has a frequency of about 50 Hz, and is a low frequency signal. Therefore, in this application, the decoupling circuit 810 may be used to filter out a high frequency signal, to correspondingly obtain the low frequency signal and the direct-current signal that are generated by the photovoltaic module. In actual application, the decoupling circuit may include but is not limited to a capacitive decoupling circuit and an inductance decoupling circuit. Details are not described in this application.

The inverter 812 may be configured to convert the direct-current signal generated by the photovoltaic module into a corresponding alternating-current signal, which is transmitted to a power grid 814 to supply power.

When the apparatus includes the controller 806, the coupling and impedance matching circuit 808, the decoupling circuit 810, and the inverter 812, the controller may collect the output signal (e.g., the first signal) between the positive electrode and the negative electrode of the photovoltaic module by using the inverter, and then adjust, based on the first signal, the high frequency signal generated by the signal generator 804, so as to subsequently suppress the degradation phenomenon of the photovoltaic module better and more effectively by using the high frequency signal.

In an embodiment, the first signal (e.g., the above-mentioned open-circuit signal, the short-circuit signal or the output-power signal) output between the positive electrode and the negative electrode of the photovoltaic module may be collected based on an actual user demand by using the inverter. For how to collect the first signal by using the inverter and how to adjust the high frequency signal based on the first signal, details are not described herein. For details, refer to related descriptions in the foregoing embodiments.

In an optional embodiment, the high frequency signal may be applied to the photovoltaic module in a plurality of manners. The following describes several implementations by using examples, and correspondingly provides schematic structural diagrams of the apparatus.

Figure 9A:
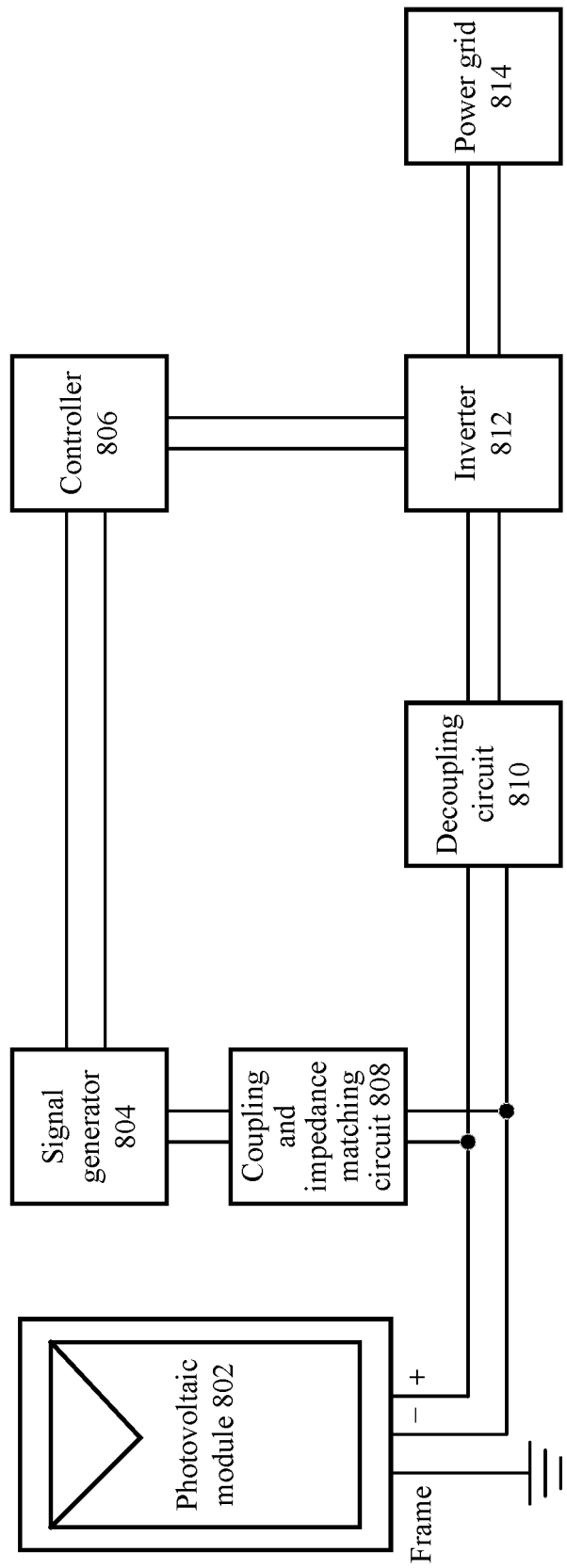
FIG. 9A to FIG. 9D are schematic structural diagrams of other several degradation phenomenon treatment apparatuses based on a photovoltaic module according to an embodiment of the invention.

In some implementations, the high frequency signal may be applied between the positive electrode and the negative electrode of the photovoltaic module. FIG. 9A is a schematic structural diagram of the apparatus according to an embodiment of the invention. As shown in FIG. 9A, the signal generator 804 corresponding to the high frequency signal may be electrically connected to the positive electrode and the negative electrode of the photovoltaic module through the coupling and impedance matching circuit 808.

Figure 9B:
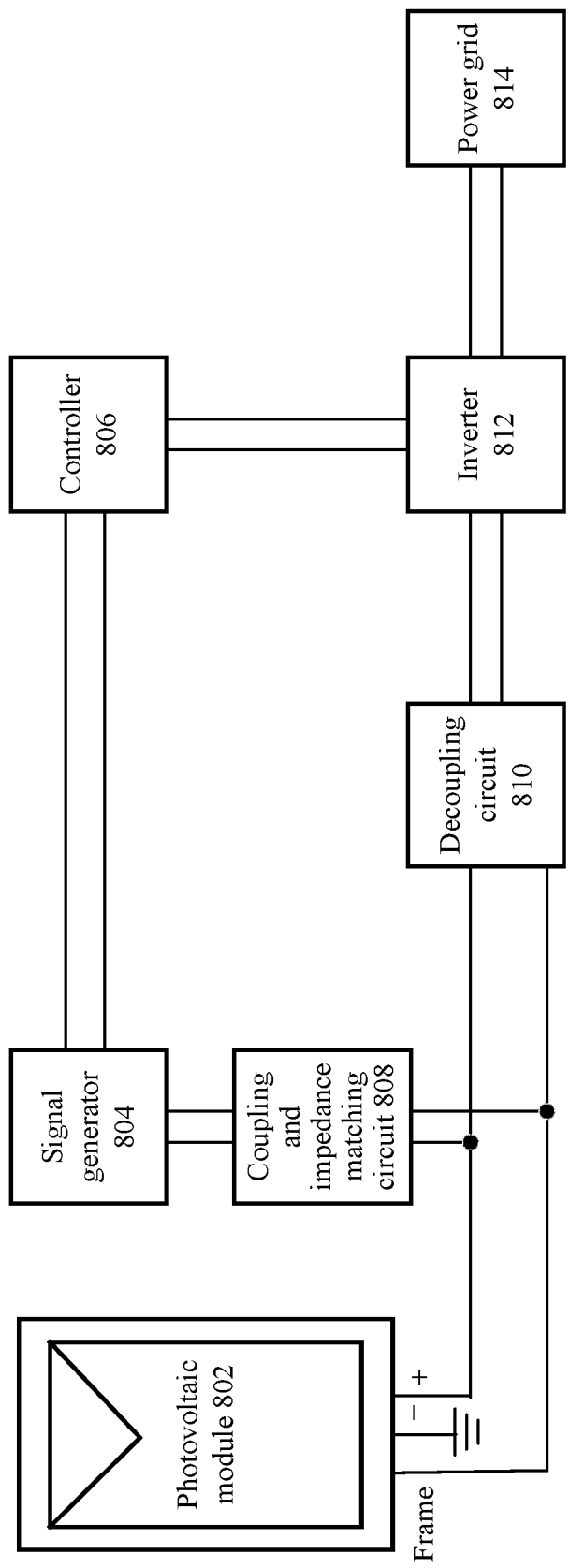

In still some implementations, the high frequency signal may be applied between the positive electrode and the frame of the photovoltaic module. Correspondingly, FIG. 9B is another schematic structural diagram of the apparatus according to an embodiment of the invention. As shown in FIG. 9B, the signal generator 804 corresponding to the high frequency signal may be electrically connected to the positive electrode and the frame of the photovoltaic module through the coupling and impedance matching circuit 808.

Figure 9C:
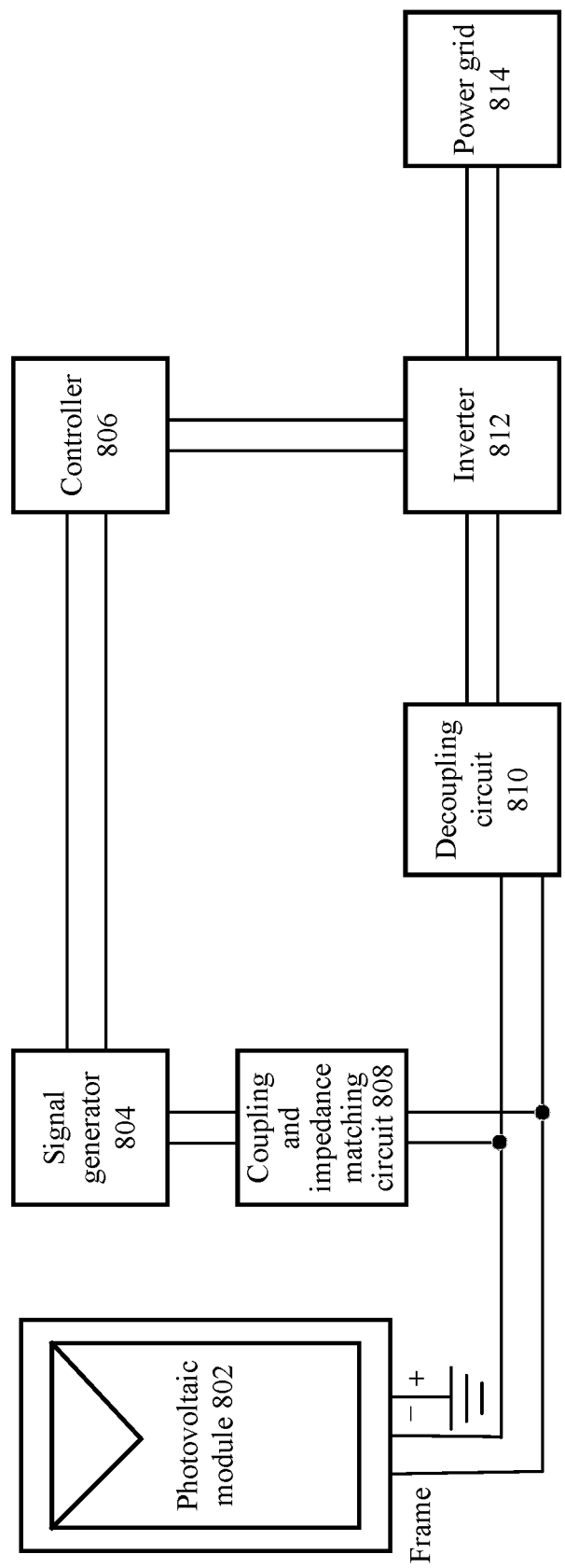

In still some implementations, the high frequency signal may be applied between the negative electrode and the frame of the photovoltaic module. Correspondingly, FIG. 9C is another schematic structural diagram of the apparatus according to an embodiment of the invention. As shown in FIG. 9C, the signal generator 804 corresponding to the high frequency signal may be electrically connected to the negative electrode and the frame of the photovoltaic module through the coupling and impedance matching circuit 808.

Figure 9D:
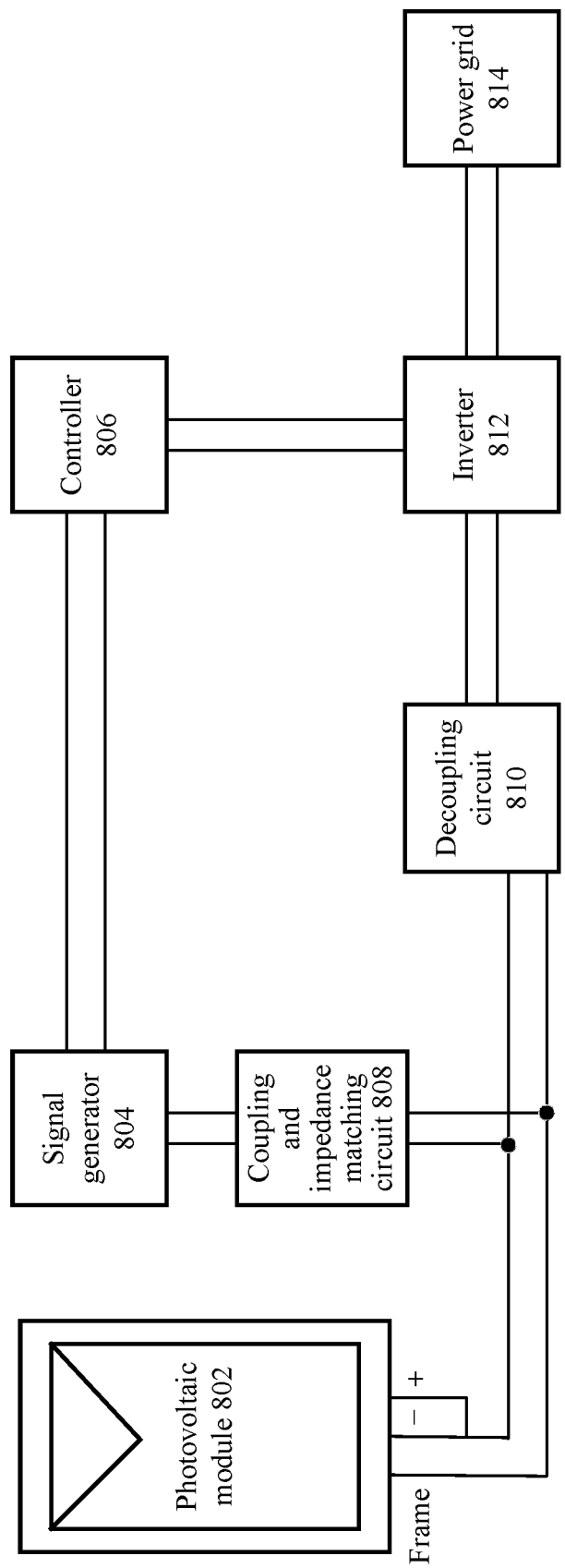

In still some embodiments, after the positive electrode and the negative electrode of the photovoltaic module are short-circuited, the high frequency signal may be applied between either of the short-circuited electrodes (e.g., the short-circuited positive electrode or the short-circuited negative electrode) and the frame of the photovoltaic module. Correspondingly, FIG. 9D is another schematic structural diagram of the apparatus according to an embodiment of the invention. As shown in FIG. 9D, the signal generator 804 corresponding to the high frequency signal may be electrically connected to the short-circuited negative electrode and the frame of the photovoltaic module through the coupling and impedance matching circuit 808.

For how the positive electrode and the negative electrode of the signal generator are electrically connected to the positive electrode and the negative electrode or the frame of the photovoltaic module, correspondingly refer to related descriptions in the embodiments described in FIG. 4A to FIG. 4D. Details are not described herein again.

It should be noted that, for a part that is not illustrated or described in this embodiment, reference may be made to the related description in the foregoing embodiments, and for the apparatus described in this application, reference may be correspondingly made to the related description in the foregoing method embodiments. Details are not described herein again.

Sequence adjustment, merging, and deletion may be performed on modules or circuits of the apparatus in the embodiments of the invention according to an actual requirement. The module or the circuit in the embodiments of the invention may be implemented by using a universal integrated circuit, for example, a central processing unit (CPU), or an application integrated circuit (ASIC), or the like.

What is disclosed above is merely example embodiments of the invention, and certainly is not intended to limit the protection scope of embodiments of the invention. A person of ordinary skill in the art may understand that all or some of processes that implement the foregoing embodiments and equivalent modifications made in accordance with the claims of the application shall fall within the scope of embodiments of the invention.

What is claimed is:

1. A degradation phenomenon treatment method, comprising:
    applying a signal with a frequency within a predetermined range to a photovoltaic module when a degradation phenomenon occurs in the photovoltaic module to release charges accumulating in the photovoltaic module to protect the photovoltaic module and suppress or eliminate the degradation phenomenon;
    wherein the degradation phenomenon refers to degradation of electricity generation efficiency of the photovoltaic module when charges accumulate in the photovoltaic module under an effect of an electric potential, and comprises a surface polarization phenomenon and a potential induced degradation (PID) phenomenon, the surface polarization phenomenon referring to accumulation of negative charges on a surface of the photovoltaic module under an effect of a positive bias voltage, and the PID phenomenon referring to migration of metal ions in glass of the photovoltaic module under an effect of a negative bias voltage;
    wherein when the degradation phenomenon refers to the surface polarization phenomenon, the signal is applied to the photovoltaic module to excite the negative charges accumulating on the surface of the photovoltaic module into the photovoltaic module to suppress the surface polarization phenomenon of the photovoltaic module; and
    wherein when the degradation phenomenon refers to the PID phenomenon, the signal is applied to the photovoltaic module to make the metal ions in the glass of the photovoltaic module stay inside the glass to suppress the PID phenomenon of the photovoltaic module.

2. The method according to claim 1, wherein the applying the signal with the frequency with the predetermined range to the photovoltaic module comprises at least one of the following:
    applying the signal between a positive electrode and a negative electrode of the photovoltaic module;
    when the photovoltaic module comprises a frame, applying the signal between the positive electrode and the frame of the photovoltaic module, or between the negative electrode and the frame of the photovoltaic module; or
    when the photovoltaic module comprises the frame, and the positive electrode and the negative electrode of the photovoltaic module are short-circuited, applying the signal between the negative electrode and the frame of the photovoltaic module.

3. The method according to claim 1, wherein the signal is an alternating-current signal or a combination of the alternating-current signal and a direct-current signal.

4. The method according to claim 1, wherein the signal generates m energy levels in the photovoltaic module, enabling electrons and electron holes to jump between the m energy levels when the photovoltaic module is exposed to light, thereby reducing a probability of recombination of the electrons and the electron holes and increasing the electricity generation efficiency of the photovoltaic module, wherein m is a positive integer.

5. The method according to claim 1, wherein a frequency of the signal ranges from 0.1 MHz to 100 THz.

6. The method according to claim 1, wherein an amplitude of the signal ranges from 0.1 V to 1 kV.

7. A degradation phenomenon treatment apparatus, comprising:
    a photovoltaic module; and
    a signal generator coupled to the photovoltaic module;
    wherein the signal generator is configured to
        generate a signal with a frequency within a predetermined frequency, and
        apply the signal to the photovoltaic module when a degradation phenomenon occurs in the photovoltaic module to release charges accumulating in the photovoltaic module to protect the photovoltaic module and suppress or eliminate the degradation phenomenon, wherein the degradation phenomenon refers to degradation of electricity generation efficiency of the photovoltaic module when charges accumulate in the photovoltaic module under an effect of an electric potential, and comprises a surface polarization phenomenon and a potential induced degradation (PID) phenomenon, the surface polarization phenomenon referring to accumulation of negative charges on the surface of the photovoltaic module under an effect of a positive bias voltage, and the PID phenomenon referring to migration of metal ions in glass of the photovoltaic module under an effect of a negative bias voltage,
    wherein when the degradation phenomenon refers to the surface polarization phenomenon, the signal is applied to the photovoltaic module to excite the negative charges accumulating on the surface of the photovoltaic module into the photovoltaic module to suppress the surface polarization phenomenon of the photovoltaic module, and
    wherein when the degradation phenomenon refers to the PID phenomenon, the signal is applied to the photovoltaic module to make the metal ions in the glass of the photovoltaic module stay inside the glass to suppress the PID phenomenon of the photovoltaic module.

8. The apparatus according to claim 7, further comprising:
    a controller;
    wherein the controller is configured to adjust, based on a first signal, the signal generated by the signal generator to suppress or eliminate the degradation phenomenon after the signal is applied to the photovoltaic module, wherein the first signal is an open-circuit signal, a short-circuit signal or an output-power signal between a positive electrode and a negative electrode of the photovoltaic module.

9. The apparatus according to claim 8, wherein the signal is obtained when the first signal is one of the following: a maximum open-circuit signal, a maximum short-circuit signal, or a maximum output-power signal;
  wherein the maximum open-circuit signal is a maximum voltage signal or a maximum current signal between the positive electrode and the negative electrode of the photovoltaic module when the positive electrode and the negative electrode of the photovoltaic module are open-circuited;
  wherein the maximum short-circuit signal is a maximum current signal between the positive electrode and the negative electrode of the photovoltaic module when the positive electrode and the negative electrode of the photovoltaic module are short-circuited; and
  wherein the maximum output-power signal is a voltage signal or a current signal between the positive electrode and the negative electrode of the photovoltaic module under a maximum output power between the positive electrode and the negative electrode of the photovoltaic module.

10. The apparatus according to claim 7, further comprising:
  a coupling and impedance matching circuit;
  wherein the coupling and impedance matching circuit is configured to transmit the signal generated by the signal generator to apply the signal to the photovoltaic module.

11. The apparatus according to claim 7, further comprising:
  a decoupling circuit;
  wherein the decoupling circuit is configured to filter an electrical energy signal generated by the photovoltaic module to obtain a direct-current signal generated by the photovoltaic module.

12. The apparatus according to claim 11, further comprising:
  an inverter;
  wherein the inverter is configured to convert the direct-current signal generated by the photovoltaic module into a corresponding alternating-current signal, which is transmitted to a power grid to supply power.

13. The apparatus according to claim 7, wherein the applying the signal to the photovoltaic module comprises at least one of the following:
  applying the signal between a positive electrode and a negative electrode of the photovoltaic module;
  when the photovoltaic module comprises a frame, applying the signal between the positive electrode and the frame of the photovoltaic module;
  when the photovoltaic module comprises the frame, applying the signal between the negative electrode and the frame of the photovoltaic module; or
  when the photovoltaic module comprises the frame and the positive electrode and the negative electrode of the photovoltaic module are short-circuited, applying the signal between the negative electrode and the frame of the photovoltaic module.

14. The apparatus according to claim 7, wherein the signal is an alternating-current signal or a combination of the alternating-current signal and a direct-current signal.

15. The apparatus according to claim 7, wherein the signal generates m energy levels in the photovoltaic module, enabling electrons and electron holes to jump between the m energy levels when the photovoltaic module is exposed to light, thereby reducing a probability of recombination of the electrons and the electron holes and increasing the electricity generation efficiency of the photovoltaic module, wherein m is a positive integer.

16. The apparatus according to claim 7, wherein a frequency of the signal ranges from 0.1 MHz to 100 THz.

17. The apparatus according to claim 7, wherein an amplitude of the signal ranges from 0.1 V to 1 kV.

* * * * *

UNITED STATES PATENT AND TRADEMARK OFFICE
CERTIFICATE OF CORRECTION

| | | |
|---|---|---|
| PATENT NO. | : 11,502,643 B2 | |
| APPLICATION NO. | : 17/014584 | |
| DATED | : November 15, 2022 | |
| INVENTOR(S) | : Tao Luo, Xiaming Jing and Boning Huang | |

It is certified that error appears in the above-identified patent and that said Letters Patent is hereby corrected as shown below:

In the Claims

In Claim 7, Column 18, Line 45, delete "on the" and insert --on a--.

Signed and Sealed this
Seventh Day of February, 2023

*Katherine Kelly Vidal*

Katherine Kelly Vidal
*Director of the United States Patent and Trademark Office*